United States Patent
Zaehringer

(10) Patent No.: US 8,085,054 B2
(45) Date of Patent: Dec. 27, 2011

(54) DETECTING ARC DISCHARGES

(75) Inventor: Gerhard Zaehringer, Freiburg (DE)

(73) Assignee: HUETTINGER Elektronik GmbH + Co. KG, Freiburg (DE)

( * ) Notice: Subject to any disclaimer, the term of this patent is extended or adjusted under 35 U.S.C. 154(b) by 358 days.

(21) Appl. No.: 11/946,140

(22) Filed: Nov. 28, 2007

(65) Prior Publication Data
US 2008/0121625 A1 May 29, 2008

(30) Foreign Application Priority Data
Nov. 28, 2006 (EP) .................................. 06024603

(51) Int. Cl.
*G01R 31/12* (2006.01)
(52) U.S. Cl. ........................................................ 324/536
(58) Field of Classification Search .................... 324/536
See application file for complete search history.

(56) References Cited

U.S. PATENT DOCUMENTS

| | | | |
|---|---|---|---|
| 4,031,464 A | 6/1977 | Norberg | |
| 4,396,478 A | 8/1983 | Aizenshtein et al. | |
| 4,588,952 A | 5/1986 | Matsuoka | |
| 4,625,283 A | 11/1986 | Hurley | |
| 4,629,940 A | 12/1986 | Gagne et al. | |
| 4,694,402 A | 9/1987 | McEachern et al. | |
| 4,936,960 A | 6/1990 | Siefkes et al. | |
| 5,192,894 A | 3/1993 | Teschner | |
| 5,241,152 A | 8/1993 | Anderson et al. | |
| 5,543,689 A | 8/1996 | Ohta et al. | |
| 5,576,939 A | 11/1996 | Drummond | |
| 5,611,899 A | 3/1997 | Maass | |
| 5,698,082 A | 12/1997 | Teschner et al. | |
| 5,718,813 A | 2/1998 | Drummond et al. | |
| 5,729,145 A * | 3/1998 | Blades .......................... | 324/536 |
| 5,804,975 A * | 9/1998 | Alers et al. ...................... | 324/613 |
| 5,889,391 A | 3/1999 | Coleman | |
| 5,993,615 A | 11/1999 | Abry et al. | |
| 6,007,879 A | 12/1999 | Scholl | |
| 6,060,837 A | 5/2000 | Richardson et al. | |
| 6,063,245 A | 5/2000 | Frach et al. | |
| 6,162,332 A | 12/2000 | Chiu | |
| 6,213,050 B1 | 4/2001 | Liu et al. | |
| 6,222,321 B1 | 4/2001 | Scholl et al. | |
| 6,332,961 B1 | 12/2001 | Johnson et al. | |
| 6,416,638 B1 | 7/2002 | Kuriyama et al. | |

(Continued)

FOREIGN PATENT DOCUMENTS
DE        4127504        2/1993
(Continued)

OTHER PUBLICATIONS

Ochs et al., "Advanced Power Supplies designed for Plasma Deposition and Etching", Vakuum in Forschung und Praxis, vol. 8, No. 5, Sep. 26, 2006, pp. 32-36.

(Continued)

*Primary Examiner* — Thomas Valone
(74) *Attorney, Agent, or Firm* — Fish & Richardson P.C.

(57) ABSTRACT

To detect arc discharges occurring in a plasma, a parameter of the plasma process is determined, and after a first period of time following the detection of an arc discharge the parameter is again determined. In the event that after the first period of time no arc discharge is detected, a first arc suppression countermeasure for suppression of arc discharges is executed.

29 Claims, 3 Drawing Sheets

U.S. PATENT DOCUMENTS

| | | | |
|---|---|---|---|
| 6,420,863 B1 | 7/2002 | Milde et al. | |
| 6,472,822 B1 | 10/2002 | Chen et al. | |
| 6,535,785 B2 | 3/2003 | Johnson et al. | |
| 6,621,674 B1 | 9/2003 | Zahringer et al. | |
| 6,633,017 B1 | 10/2003 | Drummond et al. | |
| 6,736,944 B2 | 5/2004 | Buda | |
| 6,740,207 B2 | 5/2004 | Kloeppel et al. | |
| 6,753,499 B1 | 6/2004 | Yasaka et al. | |
| 6,783,795 B2 | 8/2004 | Inoue et al. | |
| 6,791,274 B1 | 9/2004 | Hauer et al. | |
| 6,859,042 B2 * | 2/2005 | Parker | 324/536 |
| 6,878,248 B2 | 4/2005 | Signer et al. | |
| 6,943,317 B1 * | 9/2005 | Ilic et al. | 219/121.57 |
| 6,967,305 B2 | 11/2005 | Sellers | |
| 7,016,172 B2 | 3/2006 | Escoda | |
| 7,081,598 B2 | 7/2006 | Ilic et al. | |
| 7,262,606 B2 | 8/2007 | Axenbeck et al. | |
| 7,301,286 B2 | 11/2007 | Kuriyama | |
| 7,408,750 B2 | 8/2008 | Pellon et al. | |
| 2004/0031699 A1 | 2/2004 | Shoji | |
| 2004/0079733 A1 | 4/2004 | Kawaguchi et al. | |
| 2004/0182697 A1 | 9/2004 | Buda | |
| 2004/0212312 A1 | 10/2004 | Chistyakov | |
| 2005/0051270 A1 | 3/2005 | Sasaki et al. | |
| 2005/0093459 A1 | 5/2005 | Kishinevsky | |
| 2005/0135025 A1 | 6/2005 | Escoda | |
| 2006/0011473 A1 | 1/2006 | Kuriyama et al. | |
| 2006/0054601 A1 | 3/2006 | Ilic et al. | |
| 2006/0100824 A1 | 5/2006 | Moriya | |
| 2006/0181816 A1 | 8/2006 | Pellon et al. | |
| 2006/0213761 A1 | 9/2006 | Axenbeck et al. | |
| 2007/0073498 A1 | 3/2007 | Winterhalter et al. | |
| 2007/0121267 A1 | 5/2007 | Kotani et al. | |
| 2007/0168143 A1 | 7/2007 | Axenbeck et al. | |
| 2007/0251813 A1 | 11/2007 | Ilic et al. | |
| 2008/0122369 A1 | 5/2008 | Nitschke | |
| 2008/0133154 A1 | 6/2008 | Krauss | |
| 2008/0216745 A1 | 9/2008 | Wiedemuth et al. | |
| 2008/0218923 A1 | 9/2008 | Wiedemuth | |
| 2008/0257869 A1 * | 10/2008 | Nitschke et al. | 219/121.54 |

FOREIGN PATENT DOCUMENTS

| | | |
|---|---|---|
| DE | 4326100 | 2/1995 |
| DE | 4420951 | 12/1995 |
| DE | 19651615 | 7/1997 |
| DE | 19848636 | 5/2000 |
| DE | 10034895 | 2/2002 |
| DE | 10119058 | 10/2002 |
| DE | 102004015090 | 11/2005 |
| DE | 102006002333 | 7/2007 |
| EP | 0713242 | 5/1996 |
| EP | 0 967 697 | 12/1999 |
| EP | 0692138 | 1/2004 |
| EP | 1 441 576 | 7/2004 |
| EP | 1705687 | 9/2006 |
| EP | 1720195 | 11/2006 |
| EP | 1 121 705 | 1/2009 |
| JP | 06132095 | 5/1994 |
| JP | 08-167500 | 6/1996 |
| JP | 08222398 | 8/1996 |
| JP | 09170079 | 6/1997 |
| JP | 2000117146 | 4/2000 |
| JP | 2005077248 | 3/2005 |
| WO | WO 94/25977 | 11/1994 |
| WO | WO 01/13402 | 2/2001 |
| WO | WO 03/037047 | 5/2003 |
| WO | WO 03 /088445 | 10/2003 |
| WO | WO 2006/014212 | 2/2006 |
| WO | WO2006116445 | 11/2006 |

OTHER PUBLICATIONS

Van Zyl et al., "Managing Arcs in RF Powered Plasma Processes", Society of Vacuum Coaters, 48th Annual Technical Conference Proceedings, 2005, pp. 44-49.

Zlatanovic et al., "Glow-to-Arc Transition Instability Sensor in Processing Plasma", Proc. 20th International Conference on Microelectronics, vol. 2, Sep. 12-14, 1995, pp. 597-600.

Translation of Office Action from correspondence Japanese Application No. 2007-504279, dated Sep. 28, 2009, 4 pages.

Search Report from corresponding European Application No. 06 024 603.0, mailed May 15, 2007, 6 pages.

European Patent Office Action for Application No. 06 024 603.0, dated Aug. 13, 2010, 6 pages.

* cited by examiner

DETECTING ARC DISCHARGES

CROSS REFERENCE TO RELATED APPLICATION

This application claims priority under 35 U.S.C. §119(a) from EP application No. 06 024 603.0, filed Nov. 28, 2006, the entire contents of which are hereby incorporated by reference.

TECHNICAL FIELD

The invention relates to detecting arc discharges and, in particular, detecting arc discharges in a plasma process by monitoring a parameter of the plasma process.

BACKGROUND

Plasma processes occur, for example, in plasma treatment devices and coating devices. Because of the use of a sputtering process and a DC voltage to generate plasma, these devices are also called DC current sputtering systems. In systems of this kind, flashovers often occur, in which a current seeks an electrically conducting passage in the plasma. In particular, flashovers occur during the so-called reactive coating of a substrate. Flashovers can be caused by the circumstance that in addition to the substrate also parts of the sputtering system, such as the inner wall of a process chamber or parts of masks, are coated with electrically non-conducting or poorly conducting materials, which then accumulate charge until a breakdown voltage is reached.

To prevent further damage to the sputtering system, after the occurrence of a flashover, the current supplied by the plasma power supply is switched off, or the current is briefly interrupted. Alternatively, the voltage applied to the plasma chamber can also be short-circuited or reversed in polarity. To initiate the above-cited measures for the suppression of arc discharges, devices for the detection of an arc discharge or arc as well as for the extinction of the arc discharge are necessary for supplying power to the plasma processes and often form an integral part of a plasma power supply.

Detected arc discharges or arcs include those arc discharges that are quickly extinguished without intervention (so-called short arcs) and those that remain in existence for a longer period, and in certain circumstances, can lead to the complete destruction or extinction of the plasma, and to corresponding impairment of the used systems, substrates, etc. (so-called hard arcs).

Because an interruption of the plasma power supply or a reversal in polarity of the same negatively affects the throughput of the plasma process, and because short arcs are self-extinguishing, it is customary not to initiate countermeasures in response to detecting only short arcs.

SUMMARY

In one general aspect of the invention, a method of responding to arc discharges occurring in a plasma process includes monitoring a parameter of the plasma process to determine whether an arc discharge is present, upon determining that an arc discharge is present, checking the monitored parameter again after a first, predetermined period of time to determine if the arc discharge is still present, and upon determining that the arc discharge is no longer present when the parameter is rechecked, executing a first arc suppression countermeasure.

In another aspect, a plasma process arc discharge detection device includes
a monitor configured to monitor a parameter of a plasma process and to generate and output a monitoring signal indicating detection of an arc discharge, a timer configured to determine and output a time signal associated with a time period elapsed since generation of the monitoring signal, a controller configured to initiate arc suppression countermeasures for the suppression of arc discharges based on the monitoring signal and the elapsed time, wherein the controller is configured to trigger a first arc suppression countermeasure if the monitor no longer outputs the monitoring signal indicating detection of the arc discharge at completion of a first predetermined period of time following generation of the monitoring signal.

In another aspect, a plasma process power supply comprising the plasma process arc discharge detection is coupled to a DC power source, which is controlled by the controller of the plasma process arc discharge detection device.

Implementations may include one or more of the following features.

Executing the first arc suppression countermeasure may include interrupting power supplied to the plasma and/or reversing polarity of power supplied to the plasma.

In some embodiments, the monitored parameter is an electrical parameter of the plasma process.

The first arc suppression countermeasure can be executed over a second predetermined period of time. For example, the second period of time can be between 0.1 and 10 µs in duration.

The method may further include executing a second arc suppression countermeasure, in response to determining that an arc discharge is still present when the parameter is rechecked at a conclusion of the first period of time.

The second arc suppression countermeasure can be executed over a third predetermined period of time. The third period of time can be longer than the second period of time, for example, it can be longer than 10 µs.

The second arc suppression countermeasure can include interrupting power supplied to the plasma and/or reversing polarity of power supplied to the plasma.

The method may further include controlling a plasma power supply to change into an arc suppressing operation mode. The change can be based, for example, on the first and/or second arc suppression countermeasure.

In some embodiments, no arc suppression countermeasures are executed during the first period of time in response to any detected arc discharges.

The method may further include specifying a fourth period of time, measured from determination that an arc discharge is present and wherein during the fourth period of time no further first arc suppression countermeasures are executed. The fourth period of time can be longer than the first period of time.

In some embodiment, the controller is configured to maintain the first arc suppression countermeasure over a second predetermined period of time.

The second predetermined period of time can be adjustable by an operator.

In some embodiments, the controller is configured to initiate a second arc suppression countermeasure if the monitor continues to output the monitoring signal indicating detection of the arc discharge upon completion of the first period of time.

For example, the controller is configured to maintain the second arc suppression countermeasure over a third predetermined period of time. The third period of time can be adjustable by an operator. For example, the third period of time is adjustable over a range of length values greater than the second period of time.

In some embodiments, the controller is configured to retrigger the first arc suppression countermeasure only after the conclusion of a fourth predetermined period of time measured from detection of the arc discharge. The fourth period of time can be adjustable in length by an operator. For example, the fourth period of time is adjustable over a range of length values greater than the first period of time.

In some embodiments, the monitor is configured to monitor an electrical parameter of the plasma process.

In some embodiments, the plasma process power supply is configured to be switched off or reversed in polarity as a first arc suppression countermeasure over a second predetermined period of time as controlled by the controller.

In some embodiments, the plasma process power supply is configured to be switched off or reversed in polarity as a second arc suppression countermeasure over a third period of time as controlled by the controller.

Responding to self-extinguishing arc discharges may help to improve quality in plasma processes, for example, on the quality of a coating. Furthermore, responding to short arcs differently than to hard arcs, which naturally often require stronger countermeasures, can help to avoid requiring the plasma power supply to be inactive during inappropriately long periods of time, which could lead to an unacceptable reduction in the throughput.

Thus, some embodiments of the invention may help to satisfy increasing quality requirements without excessively impairing throughput.

In another aspect of the present invention, a method for the detection of arc discharges in a plasma process is performed, in which a parameter of the plasma process is monitored to detect arc discharges occurring in the plasma. After detection of an arc discharge, a first period of time is allowed to elapse and the parameter is then rechecked and a first countermeasure for the suppression of arc discharges is executed.

In another aspect of the present invention, an arc discharge detection device to detect arc discharges in a plasma process with the aid of a parameter of the plasma process includes a monitoring unit to monitor the parameter, which is designed to generate and output a monitoring signal in the event of detection of an arc discharge, a timer unit, which is designed to determine and output a period of time that has elapsed since generation of the monitoring signal, and a control unit that is designed so as to generate at least one control signal, as a function of the monitoring signal and the elapsed time, to control a respective countermeasure for the suppression of the arc discharge. The control unit is designed so as to generate a first control signal to trigger a first countermeasure if the monitoring unit no longer outputs the monitoring signal indicating detection of the arc discharge after elapse of a first pre-defined period of time.

In another aspect, a plasma power supply can be controlled by the control unit of the arc discharge detection device.

Another aspect of the invention features a method to control the operation of a plasma power supply, according to the principles outlined herein.

Thus, in one aspect of the present invention a (first) countermeasure for the suppression of arc discharges is actuated also in the event of self-extinguishing arc discharges. This may satisfy increasing requirements on the quality in plasma processes. However, a countermeasure of this kind may only be undertaken or initiated if previously a (self-extinguishing) arc discharge has actually been detected.

In some embodiments, the monitored parameter is an electrical parameter such as a voltage or a current.

In some embodiments, an interruption or a reversal in polarity of the plasma power supply is executed as a first countermeasure. The first countermeasure can in particular be executed during a second period of time.

In some embodiments, the plasma power supply during a certain period of time is switched off or reversed in polarity, in particular during the second period of time, as a first countermeasure compliant with the first control signal.

In order—as stated—to guarantee as small an impairment of the throughput of the plasma process as possible, in some embodiments the first countermeasure for the suppression/extinction of short arcs is only executed briefly, e.g. that the second period of time is between 0.1 and 10 µs in duration.

In some embodiments, the second period of time is adjustable and in particular is between 0.1 and 10 µs in duration.

In some embodiments, in the event that an arc discharge is still detected after elapse of the first period of time, a second countermeasure for the suppression of arc discharges, of different parameters than the first countermeasure, is executed. Thus, a response can be made to hard arcs as normal with an appropriate, e.g. relatively long, period of time for switching off or reversing polarity.

In some embodiments, the control unit is designed so as to generate a second control signal for a second countermeasure if the monitoring unit continues to output the monitoring signal indicating detection of the arc discharge after elapse of the first period of time.

In some embodiments, an interruption or a reversal in polarity of the plasma power supply is executed as a second countermeasure, during, for example, a third period of time. The third period of time can be longer than the second period of time and preferably longer than 10 µs in duration.

In some embodiments, the plasma power supply is switched off or reversed in polarity during a further predetermined period of time, in particular during the third period of time. The third period of time can be adjustable, such as over a range of values larger than the second period of time.

In some embodiments, during the first period of time no response is made to detecting any further arc discharges. If further arc discharges occur, namely during the period of time after the detection of a first arc discharge and up to the elapse of the first period of time, the arc discharges do not need to be taken into account. Should—as described above—the arc discharge still continue to be present, namely after the first period of time, the arc discharge can be dealt with as a hard arc and can be suppressed with an appropriately matched strong countermeasure. If, however, the first arc discharge is no longer present at the conclusion of the first period of time, the brief switch off or reversal of polarity (e.g. the first countermeasure) will have also avoided any "irregularities" associated with any arc discharges that may have occurred in the intermediate period of time.

In some examples, during a fourth period of time from the detection of the arc discharge no further first countermeasures are executed, so as to maintain a desired treatment rate. In such cases, the fourth period of time is preferably longer than the first period of time.

In some embodiments, the control unit is designed so as not to regenerate the first control signal before the elapse of a fourth period of time from the detection of an arc discharge. The length of the fourth period of time can be adjustable, such as over a range of values larger than the length of the first period of time. By means of the specification and/or adjustment of the fourth period of time, within which no response is made to a plurality of (additionally) detected short arcs, it is possible to increase further the treatment rate of the plasma process.

Further features and advantages of the invention ensue from the following description of examples of embodiment of the invention, from the figures of the drawing, which show individual details essential to the invention, and from the claims. The individual features can be put into effect in a variant of the invention either individually, or in a plurality of any kind of combination.

DETAILED DESCRIPTION

Figure 1:
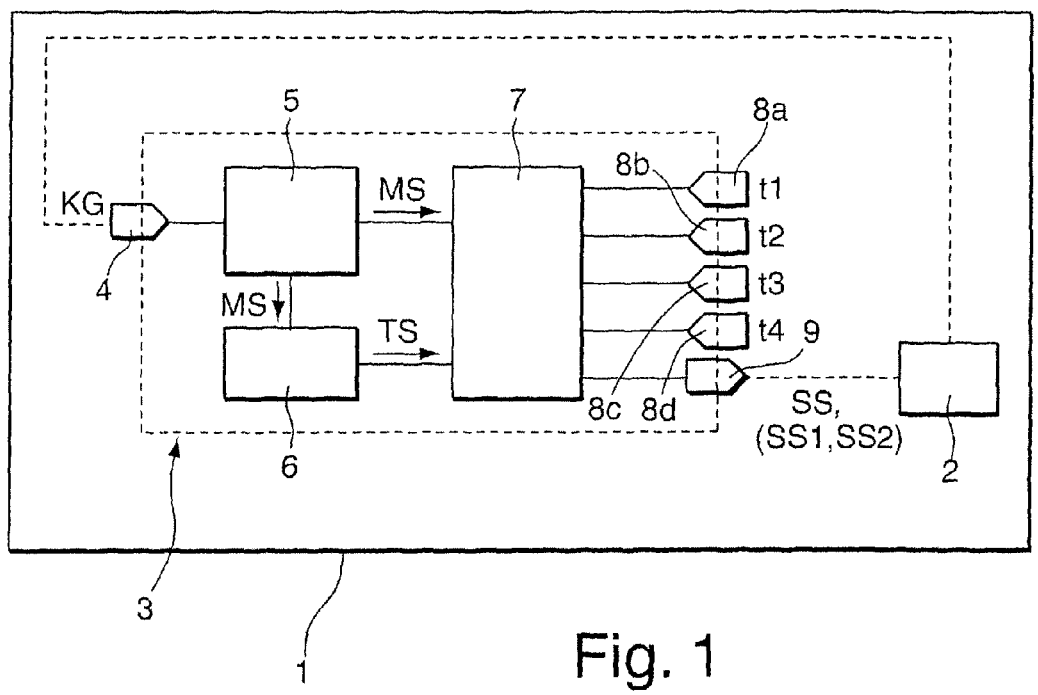
FIG. 1 shows a block diagram of an embodiment of a power supply for a plasma process.

FIG. 1 shows a schematic block diagram of a plasma power supply 1 for a plasma process. The plasma power supply 1 includes a DC voltage source 2 for the supply of the (not shown) plasma process with a DC voltage, and an arc discharge detection device 3. Within the plasma power supply 1, the arc discharge detection device 3 interacts via signals with the DC voltage source 2 to detect arc discharges in the plasma process.

For this purpose, the arc discharge detection device 3 has a first input port 4 for an electrical parameter KG of the DC voltage source 2. The electrical parameter KG may either be a voltage or a current, wherein a voltage drop or an increase in current at the DC voltage source 2 indicates that an arc discharge is taking place, or at least is in the process of evolving, in the plasma process.

The arc discharge detection device 3 furthermore comprises a monitoring unit 5, which is connected with the input port 4 through a signal connection. In addition, the arc discharge detection device 3 has a timer unit 6 and a control unit 7. In FIG. 1, the control unit 7 has further input ports 8a-8d as well as an output port 9. The control unit 7 and thus the arc discharge detection device 3 are connected via the output port 9 and a signal connection with the DC voltage source 2. Signal connections also exist between the monitoring unit 5 and the timer unit 6, between the monitoring unit 5 and the control unit 7, and between the timer unit 6 and the control unit 7.

The monitoring unit 5 of the arc discharge detection device 3 is configured to monitor the electrical parameter of the DC voltage source 2 inputted at the input port 4, for example, by comparison with a reference or threshold value (not shown). Thus, the monitoring unit 5 can in particular be configured to detect a drop in the voltage of the DC voltage source 2 and/or a rise in the current of the DC voltage source 2 by comparison with an appropriate reference value, which accordingly indicates the presence or the evolution of an arc discharge in the plasma process. In the event of detecting an arc discharge, the monitoring unit 5 is furthermore configured to generate an appropriate monitoring signal MS, and in particular, to output that signal to the timer unit 6. Furthermore, in the event of detection of the arc discharge, the monitoring signal MS is also outputted to the control unit 7, as shown in FIG. 1.

In this description, the term "generation" of a signal is used, without any limitation of its generality, such that the signal is switched to a high logic state ("1"). However, alternative signal forms can also be implemented. For example, the signal can be switched at least in part to a low logic state. This will be discussed in more detail in connection with FIG. 2.

The timer unit 6 is configured to determine a period of time that has elapsed since generation of the monitoring signal MS by the monitoring unit 5, and to output the time signal TS to the control unit 7, as shown in FIG. 1. Thus, based on the monitoring signal MS of the monitoring unit 5 and the time signal TS of the timer unit 6, it is known to the control unit 7, whether and, if applicable, since when an arc discharge is taking place in the plasma process or is in the process of evolving.

The control unit 7 is configured to generate at least one control signal SS that depends on the supplied monitoring signal MS and the time that has elapsed since detection of an arc discharge compliant to the time signal TS. The control signal SS is then output via the output port 9 to the DC voltage source 2 to control the plasma power supply 1 in view of a relevant countermeasure for the suppression of the arc discharge. For example, the control signal SS can be a signal by means of which a switch-off or a reversal of polarity of the DC voltage source 2 can be effected to suppress (extinguish) an arc discharge detected in the plasma process.

To implement a differentiation between the self-extinguishing short arcs and non self-extinguishing hard arcs, the control unit 7 is furthermore configured to generate a first control signal SS1 for a first countermeasure, and to output this signal via the output port 9 to the DC voltage source 2. The first control signal is generated and output if, after a pre-defined first period of time, (as indicated by the time signal TS of the timer unit 6) the monitoring unit 5 no longer outputs the monitoring signal MS, which indicates the detection of an arc discharge. In other words: if the time signal TS of the timer unit 6 indicates the elapse of a pre-defined first period of time, and if at this point in time after a previously detected arc discharge the monitoring signal MS of the monitoring unit 5 no longer indicates any arc discharge in the plasma process, e.g. MS=0, then the control unit 7 outputs the first control signal SS1 via the output port 9 to the DC voltage source 2 to perform the first countermeasure. In this case, a "countermeasure" can take the form either of the switching off of the DC voltage source 2, i.e., an interruption of the plasma power supply, or of a reversal in polarity of the DC voltage source 2, to extinguish the arc discharge even more efficiently.

The fact that at the conclusion of the first period of time the arc discharge detected previously and the monitoring signal MS are no longer present is an indication for an appropriate choice of the pre-defined first period of time that the detected arc discharge was a self-extinguishing arc discharge, i.e. a short arc. The response to a short arc of this kind is made with an appropriate first countermeasure, further details of which are discussed below in connection with FIG. 2.

If, however, at the end of the first period of time the monitoring signal MS continues to indicate an arc discharge, i.e. MS=1, then the control unit 7 generates a second control signal SS2, which differs from the first control signal SS1, and outputs the second control signal SS2 via the output port 9 to the DC voltage source 2 to initiate the second countermeasure. As already discussed above, the second countermeasure is different from the first countermeasure. In other words: if after the first period of time the previously detected arc discharge is still present, one is dealing with a non self-extinguishing hard arc, to which the response is made with the specific second countermeasure. In some examples, the first and second countermeasures differ advantageously in view of the length of the time period during which they are performed. In particular, a second adjustable period of time, during which the first countermeasure is effected by the control signal SS1, is shorter than a third period of time, during which the second countermeasure is effected by the control signal SS2. The adjustable first, second and third periods of time t1-t3 can be entered into the control unit 7 via the respective input ports 8a-8c shown in FIG. 1, and can thus be pre-defined.

A fourth input port 8d of the control unit 7 is shown in FIG. 1. Using the fourth input port 8d, another fourth period of time t4 can be entered and pre-defined, which is described in more detail in connection with FIG. 2.

Figure 2:
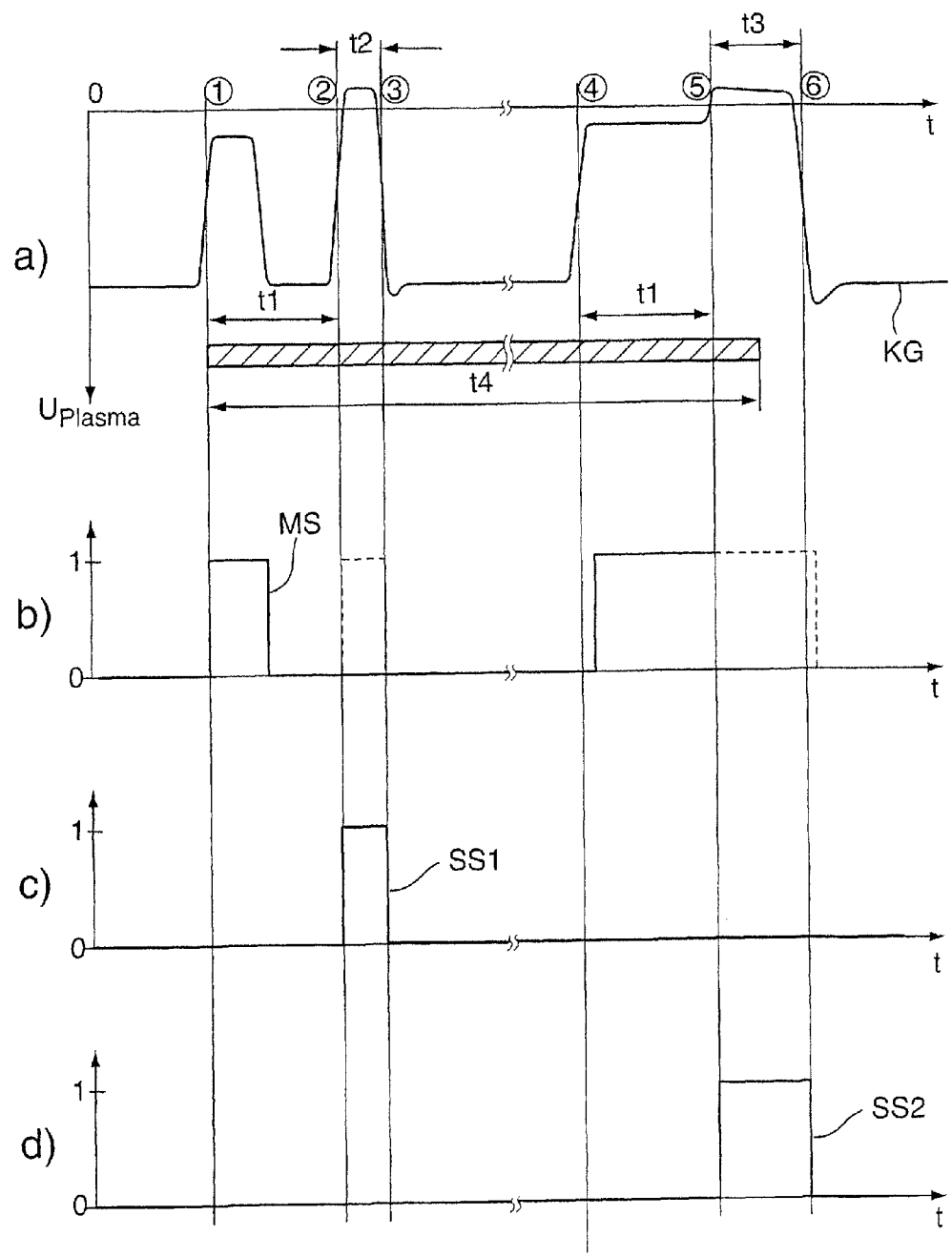
FIG. 2 shows a time sequence diagram for signals within the plasma power supply from FIG. 1.

FIG. 2 shows time sequence diagrams for signals within the plasma power supply 1 of FIG. 1. FIG. 2 is divided into four parts a) to d). Part a) represents an example of the signal characteristic of the electrical parameter KG (as shown in FIG. 1). Part b) represents an example of a signal characteristic of the monitoring signal MS. Part c) represents an example of a signal characteristic of the first control signal SS1. Part d) represents an example of a signal characteristic of the second control signal SS2. In FIG. 2, t indicates time and UPlasma indicates a plasma voltage of the plasma process under consideration, which corresponds to a voltage supplied by the DC voltage source 2 of FIG. 1.

Referring also to FIG. 2, at time ① a voltage drop occurs in the plasma process, which is caused by an arc discharge. In this case, the arc discharge is a short arc, which extinguishes itself again within a period of time t<t1, as shown in FIG. 2 in part a). In other words: before reaching time ②, which marks the elapse of the first period of time t1, the monitoring signal MS changes from a high logic state MS=1 back to a low logic state MS=0.

Nevertheless, the control unit 7 (FIG. 1) effects a reversal in polarity of the plasma voltage beginning at time ② for a period of time t2, i.e., up to time ③. Signal characteristics of the corresponding control signals are shown in parts b) and c) of FIG. 2. As shown in part a), shortly after the plasma voltage drops at time ①, e.g., drops below a certain voltage threshold (not shown), the monitoring unit 5 outputs the monitoring signal MS at a high logic state MS=1.

At time ②, the control unit 7 (FIG. 1) checks whether the monitoring signal MS is still present with a high logic state MS=1. This is not the case in the discussed example, hence the control unit 7 outputs the first control signal SS1=1 as described and shown in part c). This occurs during a second period of time t2, during which a reversal in polarity of the plasma voltage is effected. This operation mode continues up to time ③, at which the control unit 7 switches the first control signal SS1 back to a low logic state SS1=0 as shown in part c).

In part b) of FIG. 2, the monitoring signal MS is shown as a dashed line between the points in time ② und ③, during which the first countermeasure for suppression of the arc discharge is in progress. This part of the signal characteristic is, however, not relevant for the generation of the first control signal SS1.

In the right-hand part of FIG. 2, corresponding signal characteristics are shown for the case in which the detected arc discharge is a non self-extinguishing hard arc. As shown in part a), the voltage drop occurs at time ④ and continues up to time ⑤, wherein the time interval lying between the points in time ④ and ⑤ again corresponds to the first period of time t1. In part b), the corresponding signal characteristic of the monitoring signal MS of the monitoring unit 5 (FIG. 1) is shown. It can be seen that the monitoring signal MS continues to have a high logic state MS=1 up to time ⑤. Accordingly, the first control signal SS1 is not activated at time ④ but rather is held at a low logic state SS1=0 (see part c).

Instead, as shown in part d), the second control signal SS2=1 is generated and output at time ⑤ by the control unit 7 (FIG. 1). This occurs during a third period of time t3, wherein the condition t3>t2 is fulfilled, as can also be seen in the upper region of FIG. 2. The generation and output of the second control signal SS2=1 during the period of time t3 between the points in time ⑤ and ⑥ causes the second countermeasure for the suppression of the arc discharge in order to react in an appropriate manner to the occurrence of a non self-extinguishing hard arc.

In part b) of FIG. 2 a dashed line shows the continuing monitoring signal MS, which, however, after time ⑤ is of no particular concern for the generation of the control signal SS2.

In FIG. 2, another period of time, i.e. a time interval t4, is shown in part a) as a hatched bar. The value or duration of the time period t4 can be entered and pre-defined via the already mentioned fourth input port 8d of the control unit 7 as shown in FIG. 1. By specifying the fourth period of time t4, it can be possible to ensure that after the detection of a voltage drop has taken place, e.g., detection of an arc discharge and/or of the corresponding response of the monitoring unit 5 (FIG. 1), as shown in part b), no further first control signal SS=1 (see part c)) is generated up to the end of the period of time t4.

In a modification of the example illustrated in FIG. 2, this would, for example, be of concern if the voltage drop at time ④ were also be a self-extinguishing short arc (not shown in FIG. 2). Despite the fact that the monitoring signal MS shown in part b) would again indicate the detection of an arc discharge, the first control signal SS1 in analogy to part c) would remain at a low logic state, although the detected arc discharge is a short arc. This is caused by the fact that the time ⑤ for triggering the appropriate first countermeasure still falls within the time interval that is "blocked" by the period of time t4, so that no first control signal SS1=1 is generated or output.

By means of the adjustable specification of the further fourth period of time t4, within which no response is made to one or a plurality of detected short arcs, it is possible to increase the treatment rate of the relevant plasma process, wherein accordingly the condition t4>t1 must apply.

Advantageously, the second period of time t2, during which a response is made to a detected short arc, lies in the range from 1 to 10 µs. Correspondingly the third period of time t3 is greater than the second period of time t2, i.e. t3>t2. For the fourth period of time t4, the condition applies that t4>t1.

Figure 3:
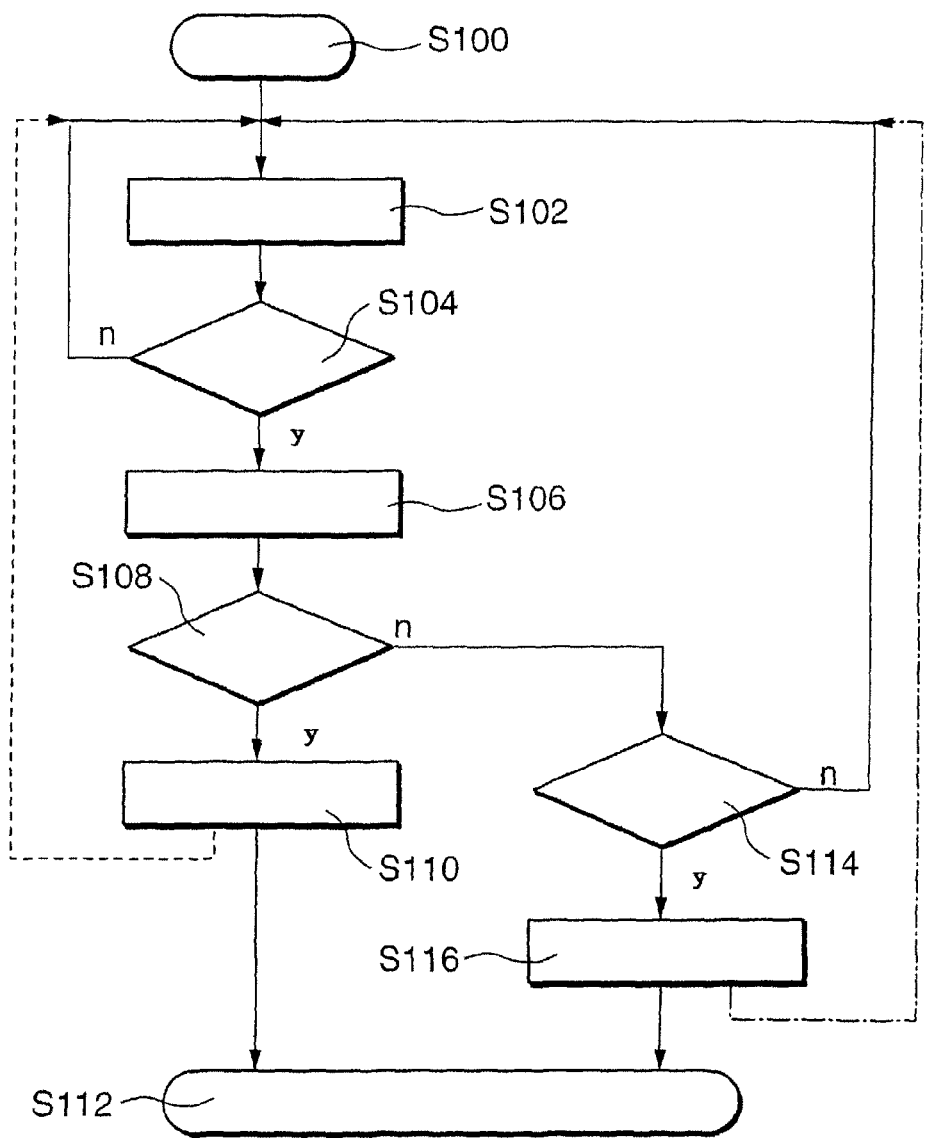
FIG. 3 shows a flow diagram of an exemplary embodiment of the method for the detection of arc discharges.

FIG. 3 shows a flow diagram illustrating operation of a plasma process. The operation begins with a step S100. In a next step S102, the monitoring of the electrical parameter takes place, e.g., the voltage or current are monitored as described above.

Thereafter, a check is made in step S104 whether the occurrence of an arc discharge can be detected on the basis of the parameter monitored in step S102. If this is not the case (n) the method returns to step S102. If, however, the query in step S104 is answered with yes (y) then during the following step S106 the period of time t1 is allowed to elapse, as described above.

Subsequently, the electrical parameter is rechecked for the presence of an arc discharge in step S108. If the arc discharge is still detected (y) one is dealing with a hard arc, and in step S110 an appropriate countermeasure takes place during a pre-defined (third) period of time, e.g. an interruption or a reversal in polarity of the plasma power supply. Subsequently, the operation of the plasma process is terminated in step S112, or continued in step S102 (dashed line in FIG. 3).

If the query of step S108 is answered with no (n), i.e., the arc discharge detected previously is no longer present after the period of time according to step S106, then a check takes place in step S114 as to whether a time interval that may have been initialized previously for the blocking of responses to a short arc (the fourth time interval t4) has elapsed or is inactive. If the check is positive (y), an appropriate countermeasure takes place in step S116 during a further pre-defined (second) period of time, wherein the countermeasure is directed to the suppression of short arcs by, for example, a corresponding interruption or reversal in polarity of the plasma power supply (as described in detail above). Subsequently, the operation of the plasma process can be terminated in step S112, or continued in step S102 (dotted-dashed line in FIG. 3).

If, however, the query in step S114 is answered with no (n), i.e. the interval t4 has not yet elapsed, then no response to the detected short arc takes place, and the method returns to step S102.

The principles discussed above are applicable to plasma power supplies that deliver DC voltage to the plasma, as described in the examples. In addition, these concepts are also applicable to plasma power supplies that deliver an AC voltage to the plasma.

In explaining these concepts, the terms "first period of time", "second period of time", "third period of time", "fourth period of time" and "timer unit" are to be construed very broadly. The terms "first", "second", etc., do not necessarily mean temporally sequential or consecutive.

As an alternative to a fixed, pre-defined period of time, a period of time can also be automatically adjusted, e.g., as a function of the rate of occurrence of the detected short or hard arcs over a set time period. A period of time can also be variable as a function of a signal that is present at an input pin of the plasma power supply. Then, a user can, for example, integrate an automatic dependence on measurements or controls, e.g., on a signal that indicates a gas pressure or a type of gas mixture.

In addition, or alternatively, to the automatic adjustment of a time period, a user may also be able to pre-select a maximum time period that is not exceeded, even if, e.g., the automatic time adjustment would provide for a longer duration. In addition, or alternatively, a minimum time can be pre-selected under that one will go below, even if an automatic time adjustment would provide for a shorter duration.

In view of the large number of parameters, which could be adjusted, one may wish to make one or a plurality of data sets of particularly advantageous settings available to the user. Then, the user can readily select between these data sets.

In another embodiment, the arc discharge detection device includes memory (not shown in the figures) for the storage of one or of a plurality of sets of pre-set parameters, which define, for example, useful adjustable time periods and threshold values and allow an operation without any delay. In some embodiments, the arc discharge detection device provides an option for the user to enter such data sets, to load them, and/or to store them. Advantageously, data sets are stored in a non-volatile memory that continues to store the data even if the arc discharge detection device is fully separated from any power supply.

Similarly, in some embodiments of the plasma power source, one can use one or a plurality of sets of pre-set parameters, which define the adjustable times and threshold values as expedient values, so that operation of the plasma power source is possible without any delay. Advantageously, the plasma power source has an option for such data sets to be stored by the user. For example, the data sets are stored in a non-volatile memory that continues to store the data even if the plasma power source is completely separated from any power supply. Furthermore, there exists the possibility that a user enters periods of time or corresponding values that are not expedient or could hinder the plasma power source to work properly, because, e.g., a period of time has been set to be much too small or much too large. This could cause that no signal is available at the output port of the arc discharge detection device. Alternatively, or in addition, the user, when attempting to enter data that are not expedient or that could be detrimental to operations, is provided with a warning message of the possible risks. Thus, a device has in addition to corresponding input means (not shown) also corresponding output means (not shown) for the warning message. In some embodiments, settings that are completely inexpedient can also be suppressed.

The monitored parameter can be an electrical parameter, as described in connection with the figures. It can, however, also be any other suitable parameter related to the plasma process.

It is to be understood that while the invention has been described in conjunction with the detailed description thereof, the foregoing description is intended to illustrate and not limit the scope of the invention, which is defined by the scope of the appended claims. Other aspects, advantages, and modifications are within the scope of the following claims.

What is claimed is:

1. A method of responding to arc discharges occurring in a plasma process, the method comprising:
monitoring a parameter of the plasma process to determine whether an arc discharge is present;
upon determining that an arc discharge is present, checking the monitored parameter after a predetermined period of time to determine if the arc discharge is still present; and
executing one of a first countermeasure and a second countermeasure based on whether the arc discharge is still present, the second countermeasure differing from the first countermeasure in at least one of a type and a duration,
wherein the first countermeasure is executed if the arc discharge is no longer present, and the second countermeasure is executed if the arc discharge is still present.

2. The method of claim 1, further comprising controlling a plasma power supply to change into an arc suppressing operation mode.

3. The method of claim 1, wherein the monitored parameter is an electrical parameter of the plasma process.

4. The method of claim 1, wherein the predetermined period of time is a first predetermined period of time, and wherein executing the first countermeasure comprises executing the first countermeasure over a second predetermined period of time.

5. The method of claim 4, wherein the second period of time is between 0.1 and 10 μs in duration.

6. The method of claim 1, wherein executing the first countermeasure includes interrupting power supplied to the plasma.

7. The method of claim 1, wherein executing the first countermeasure includes reversing polarity of power supplied to the plasma.

8. The method of 4, wherein executing the second countermeasure comprises executing the second countermeasure over a third predetermined period of time.

9. The method of claim 1, wherein executing the second countermeasure includes interrupting power supplied to the plasma.

10. The method of claim 1, wherein executing the second countermeasure includes reversing polarity of power supplied to the plasma.

11. The method of claim 8, wherein the third predetermined period of time is longer than the second predetermined period of time.

12. The method of claim 8, wherein the third predetermined period of time is longer than 10 µs.

13. The method of claim 1, wherein no countermeasures are executed during the predetermined period of time in response to any detected arc discharges.

14. The method of claim 1, further comprising specifying a time period, measured from determination that the arc discharge is present, during which no further first countermeasures are executed.

15. The method of claim 14, wherein the time period is longer than the predetermined period of time.

16. A plasma process arc discharge detection device comprising:
a plasma process parameter monitor that, responsive to detecting an arc discharge, generates a monitoring signal indicating detection of the arc discharge;
a timer circuit coupled to the plasma process parameter monitor to receive the monitoring signal and configured to determine and output a time signal associated with a time period elapsed since generation of the monitoring signal; and
a controller coupled to the plasma process parameter monitor to receive the monitoring signal and to the timer circuit to receive the time signal, the controller configured to initiate arc suppression countermeasures for the suppression of arc discharges based on the monitoring signal and the elapsed time period;
wherein the controller is configured to trigger a first countermeasure if the monitor no longer outputs the monitoring signal indicating detection of the arc discharge at completion of a predetermined period of time following generation of the monitoring signal, and is configured to initiate a second countermeasure if the monitor continues to output the monitoring signal indicating detection of the arc discharge after the predetermined period of time, the second countermeasure differing from the first countermeasure in at least one of a type and a duration.

17. The plasma process arc discharge detection device of claim 16, wherein the predetermined period of time is a first predetermined period of time, and wherein the controller is configured to maintain the first countermeasure over a second predetermined period of time.

18. The plasma process arc discharge detection device of claim 17, wherein the second predetermined period of time is adjustable by an operator.

19. The plasma process arc discharge detection device of claim 17, wherein the second predetermined period of time is between about 0.1 and 10 µs in duration.

20. The plasma process arc discharge detection device of claim 17, wherein the controller is configured to maintain the second countermeasure over a third predetermined period of time.

21. The plasma process arc discharge detection device of claim 20, wherein the third period of time is adjustable by an operator.

22. The plasma process arc discharge detection device of claim 21, wherein the third predetermined period of time is adjustable over a range of length values greater than the second predetermined period of time.

23. The plasma process arc discharge detection device of claim 16, wherein the controller is configured to retrigger the first countermeasure only after the conclusion of a time period measured from detection of the arc discharge.

24. The plasma process arc discharge detection device of claim 23, wherein the time period is adjustable in length by an operator.

25. The plasma process arc discharge detection device of claim 24, wherein the time period is adjustable over a range of length values greater than the predetermined period of time.

26. The plasma process arc discharge detection device of claim 16, wherein the plasma process parameter monitor is configured to monitor an electrical parameter of the plasma process.

27. A plasma process power supply comprising:
a plasma process arc discharge detection device comprising:
a plasma process parameter monitor having a signal generator that, responsive to detecting an arc discharge, generates a monitoring signal indicating detection of the arc discharge;
a timer circuit coupled to the plasma process parameter monitor to receive the monitoring signal and configured to determine and output a time signal associated with a time period elapsed since generation of the monitoring signal; and
a controller coupled to the plasma process parameter monitor to receive the monitoring signal and to the timer circuit to receive the time signal, the controller configured to initiate arc suppression countermeasures for the suppression of arc discharges based on the monitoring signal and the elapsed time, wherein the controller is configured to trigger a first countermeasure if the monitor no longer outputs the monitoring signal indicating detection of the arc discharge at completion of a predetermined period of time following generation of the monitoring signal, and is configured to initiate a second countermeasure if the monitor continues to output the monitoring signal indicating detection of the arc discharge after the predetermined period of time, the second countermeasure differing from the first countermeasure in at least one of a type and a duration; and
a DC power supply coupled to the plasma process arc discharge detection device and controlled by the controller of the plasma process arc discharge detection device.

28. The plasma process power supply of claim 27, wherein the predetermined period of time is a first predetermined period of time, and wherein the DC power source is switched off or reversed in polarity over a second predetermined period of time responsive to the first countermeasure being triggered by the controller.

29. The plasma process power supply of claim 28, wherein the DC power source is switched off or reversed in polarity over a third period of time responsive to the second countermeasure being triggered by the controller.

* * * * *

UNITED STATES PATENT AND TRADEMARK OFFICE
CERTIFICATE OF CORRECTION

PATENT NO. : 8,085,054 B2
APPLICATION NO. : 11/946140
DATED : December 27, 2011
INVENTOR(S) : Gerhard Zaehringer Page 1 of 1

It is certified that error appears in the above-identified patent and that said Letters Patent is hereby corrected as shown below:

In the Claims:
Column 10, Line 62, In Claim 8, delete "4" and insert --claim 4--.

Signed and Sealed this
Eighth Day of May, 2012

David J. Kappos
*Director of the United States Patent and Trademark Office*